(12) United States Patent
Chen

(10) Patent No.: US 6,388,876 B1
(45) Date of Patent: May 14, 2002

(54) COMPUTER ENCLOSURE INCORPORATING PIVOTABLE DRIVE BRACKET

(75) Inventor: Chia-Hua Chen, Tu-Chen (TW)

(73) Assignee: Hon Hai Precision Ind. Co., Ltd., Taipei (TW)

( * ) Notice: Subject to any disclaimer, the term of this patent is extended or adjusted under 35 U.S.C. 154(b) by 11 days.

(21) Appl. No.: 09/680,888

(22) Filed: Oct. 6, 2000

(30) Foreign Application Priority Data

May 30, 2000 (TW) ..................................... 89209214 U

(51) Int. Cl.[7] ................................................ G06F 1/16
(52) U.S. Cl. ........................ 361/685; 361/727; 361/684; 360/137; 312/223.2
(58) Field of Search ................................. 361/683, 685, 361/686, 684, 724–727; 312/223.1, 223.2, 270.1, 270.2, 309, 310, 311, 322, 321.5, 333; 364/708.1; 360/137, 137 D, 97.01, 98.01; 292/900, 106, 31, 101, DIG. 17, DIG. 30, DIG. 31, DIG. 43; 70/58, 57, 59; 248/551, 553, 581, 60, 609, 611, 346.03, 500, 346.04, 229.16, 200, 220.22, 240; 369/77.2, 75.1, 77.1; 211/26, 189, 190, 150; 174/35 GC, 35 R, 51; G06F 1/16

(56) References Cited

U.S. PATENT DOCUMENTS

| | | | | |
|---|---|---|---|---|
| 5,136,466 A | * | 8/1992 | Remise et al. ............... 361/391 |
| 5,566,383 A | * | 10/1996 | Gildea et al. ............... 361/685 |
| 5,572,402 A | * | 11/1996 | Jeong .......................... 361/685 |
| 5,808,864 A | * | 9/1998 | Jung ........................... 361/685 |
| 6,185,103 B1 | * | 2/2001 | Yamada ....................... 361/727 |
| 6,227,632 B1 | * | 5/2001 | Liu ........................... 312/223.2 |
| 6,273,273 B1 | * | 8/2001 | Liao ............................. 211/26 |
| 6,301,099 B1 | * | 10/2001 | Felcman et al. ............ 361/683 |
| 6,313,983 B1 | * | 11/2001 | Liu et al. ..................... 361/683 |

* cited by examiner

Primary Examiner—Lynn D. Feild
Assistant Examiner—Michael Datskovsky
(74) Attorney, Agent, or Firm—Wei Te Chung

(57) ABSTRACT

A computer enclosure includes a housing (200) and a drive bracket (10). The housing has a pair of opposite side panels (260). Each side panel defines a guiding slot (266) and a retaining recess (268). The drive bracket has a base (20) from which a pair of side walls (40) extends. Each side wall has an external guiding pivot (42) rotatably received in a corresponding guiding slot, to allow the drive bracket to rotate with respect to the housing between a first position and a second position. In the first position, ample access to an interior space of the housing is available. In the second position, the drive bracket is fully and securely installed within the housing. Each side wall of the drive bracket also has an external retaining post (44) received in the corresponding retaining recess, to firmly secure the drive bracket in the second position.

7 Claims, 5 Drawing Sheets

COMPUTER ENCLOSURE INCORPORATING PIVOTABLE DRIVE BRACKET

BACKGROUND

1. Field of the Invention

The present invention relates to a computer enclosure, and particularly to a computer enclosure incorporating a pivotable drive bracket.

2. The Related Art

The trend toward miniaturization in the computer industry requires fully exploiting the internal space of a computer. This requires components in the computer to be compactly arranged in a confined space inside the computer enclosure. Typically, components such as data storage devices are attached to the computer enclosure with screws. During attachment, each component must be supported by hand. This process is complicated and time-consuming. Furthermore, this type of mounting technique does not usually allow for installation or replacement of serviceable components located below the data storage device. Thus new techniques are being developed in an endeavor to simplify the installation process.

U.S. Pat. No. 5,599,080 discloses a rail type mounting device for a data storage device. The data storage device is secured to the mounting device by pushing pins formed on the guide rail into side holes defined in the data storage device. Then, the mounting device is slidably mounted to the computer enclosure. However, the pins are thin and pliable, and are easily bent or damaged during the installation procedure. Once the pins have become bent or damaged, subsequent realignment and reconnection of the data storage device to the enclosure is quite difficult. Moreover, the data storage device cannot be firmly secured in the enclosure, due to clearance existing between each pin and its corresponding hole. This renders the data storage device prone to damage from shock.

It is desired to overcome the above disadvantages by providing an improved mounting device for mounting a data storage device to a computer enclosure.

SUMMARY OF THE INVENTION

Accordingly, an object of the present invention is to provide a computer enclosure incorporating a pivotable drive bracket which is readily and firmly attached to the computer enclosure.

Another object of the present invention is to provide a computer enclosure incorporating a pivotable drive bracket which allows easy placement/removal of serviceable components located below a drive installed within the drive bracket.

To achieve the above-mentioned objects, a computer enclosure in accordance with the present invention comprises a housing and a drive bracket received in the housing. The housing has a pair of opposite side panels. Each side panel defines a guiding slot and a retaining recess. The drive bracket has a base from which a pair of side walls extends. Each side wall has an external guiding pivot rotatably received in the corresponding guiding slot, to allow the drive bracket to rotate with respect to the housing between a first position and a second position. In the first position, ample access to an interior space of the housing is available. In the second position, the drive bracket is fully and securely installed within the housing. Each side wall of the drive bracket also has an external retaining post which is received in the corresponding retaining recess of the housing, to firmly secure the drive bracket in the second position.

Other objects, advantages and novel features of the present invention will be drawn from the following detailed embodiment of the present invention with attached drawings, in which:

DESCRIPTION OF THE PREFERRED EMBODIMENT

A computer may comprise a variety of data storage devices such as a CD-ROM drive, a floppy disk drive (FDD) and a hard disk drive (HDD). These devices are usually secured within a computer enclosure. For the purposes of illustrating a preferred embodiment of the present invention a CD-ROM drive is used as the example data storage device in the following description. It is, however, noted that the present invention is equally applicable to other data storage devices.

Figure 3:
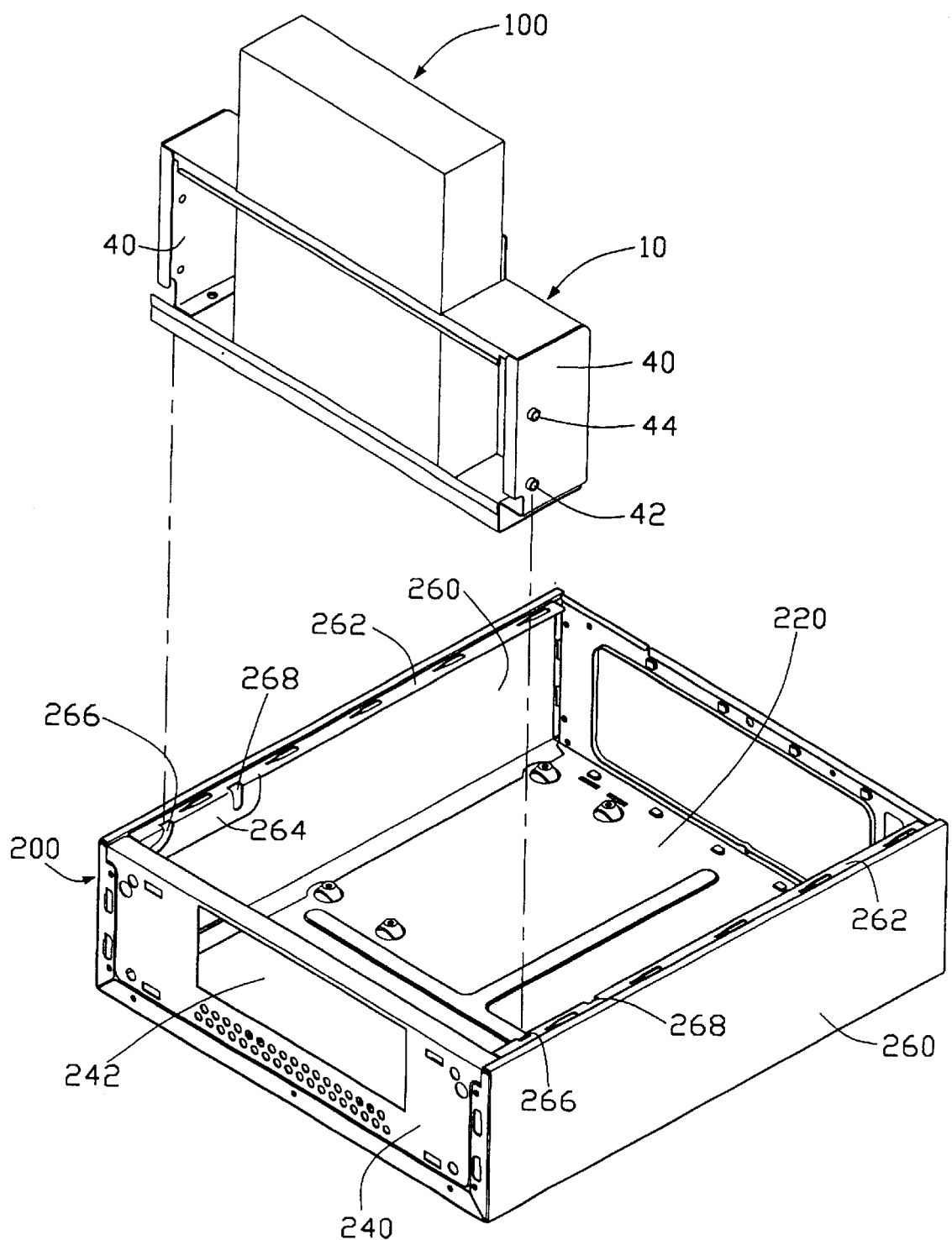
FIG. 3 is an exploded view showing the drive bracket assembly of FIG. 2 to be received in a computer enclosure of the present invention.

Referring to FIG. 3, a computer enclosure (not labeled) of the present invention includes a housing 200 and a drive bracket 10 slidably mounted to the housing 200 for securing a CD-ROM drive 100 within the computer enclosure. The housing 200 has a bottom panel 220, a pair of side panels 260 extending perpendicularly from respective opposite side edges of the bottom panel 220, and a front panel 240 extending perpendicularly from a front edge of the bottom panel 220 between the side panels 260. The top edge of each side panel 260 is bent inwardly at a right angle to form a flange 262. The flange 262 of each side panel 260 forms a bent plate 264 depending from an inner edge of the flange 262 and adjacent to the front panel 240, such that the bent plate 264 opposes the side panel 260. Each flange 262 and adjacent bent plate 264 together define a guiding slot 266 and a retaining recess 268. Each guiding slot 266 is arcuate, and extends from the junction of the flange 262 and the bent plate 264 downwardly and toward the front panel 240. Each retaining recess 268 extends from the junction of the flange 262 and the bent plate 264 downwardly. A window 242 is defined in the front panel 240, for projection of a front face (not labeled) of the CD-ROM drive 100 therethrough.

Figure 1:
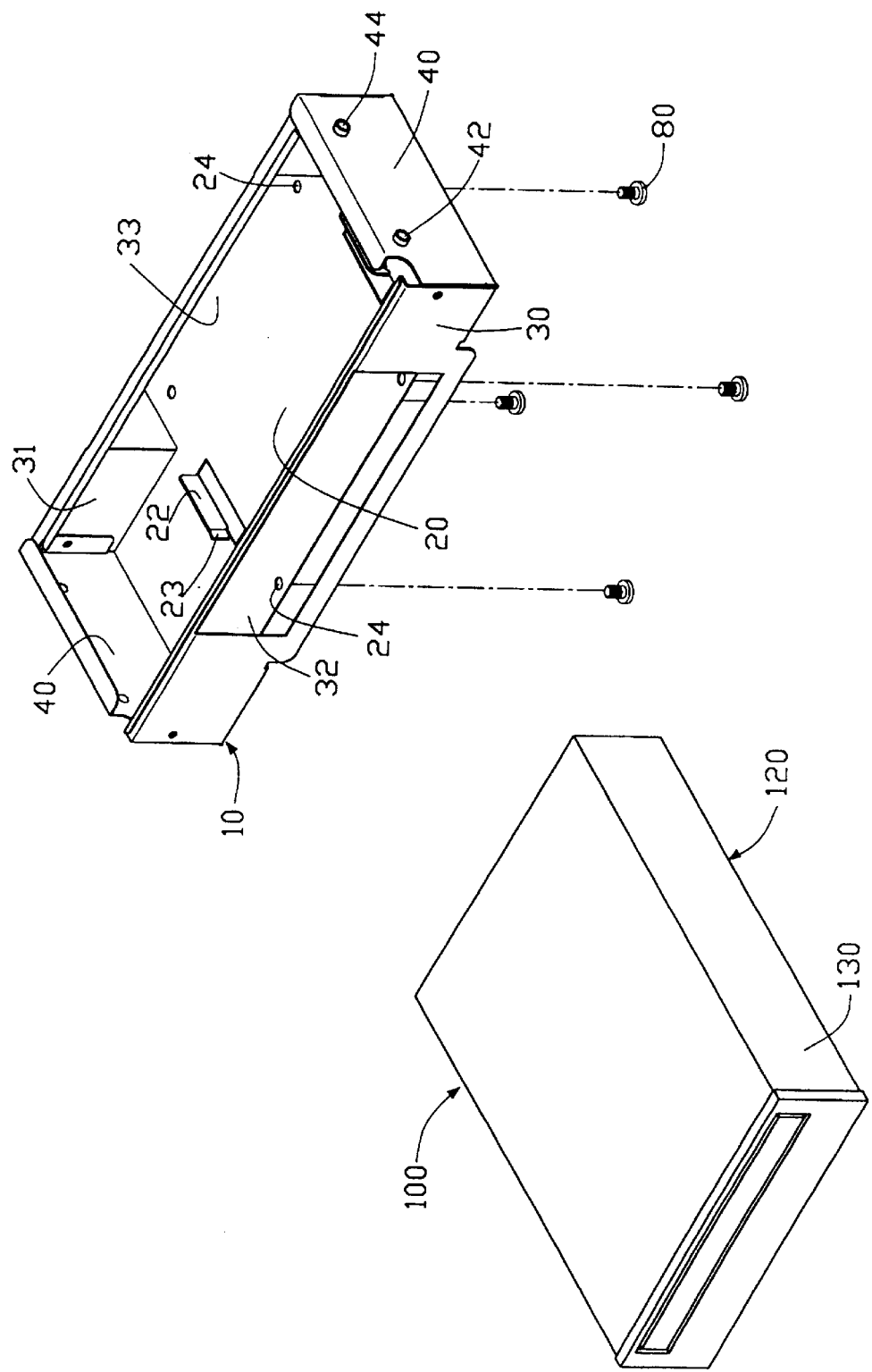
FIG. 1 is an exploded view showing a CD-ROM drive to be attached to a drive bracket of the present invention.
Figure 2:
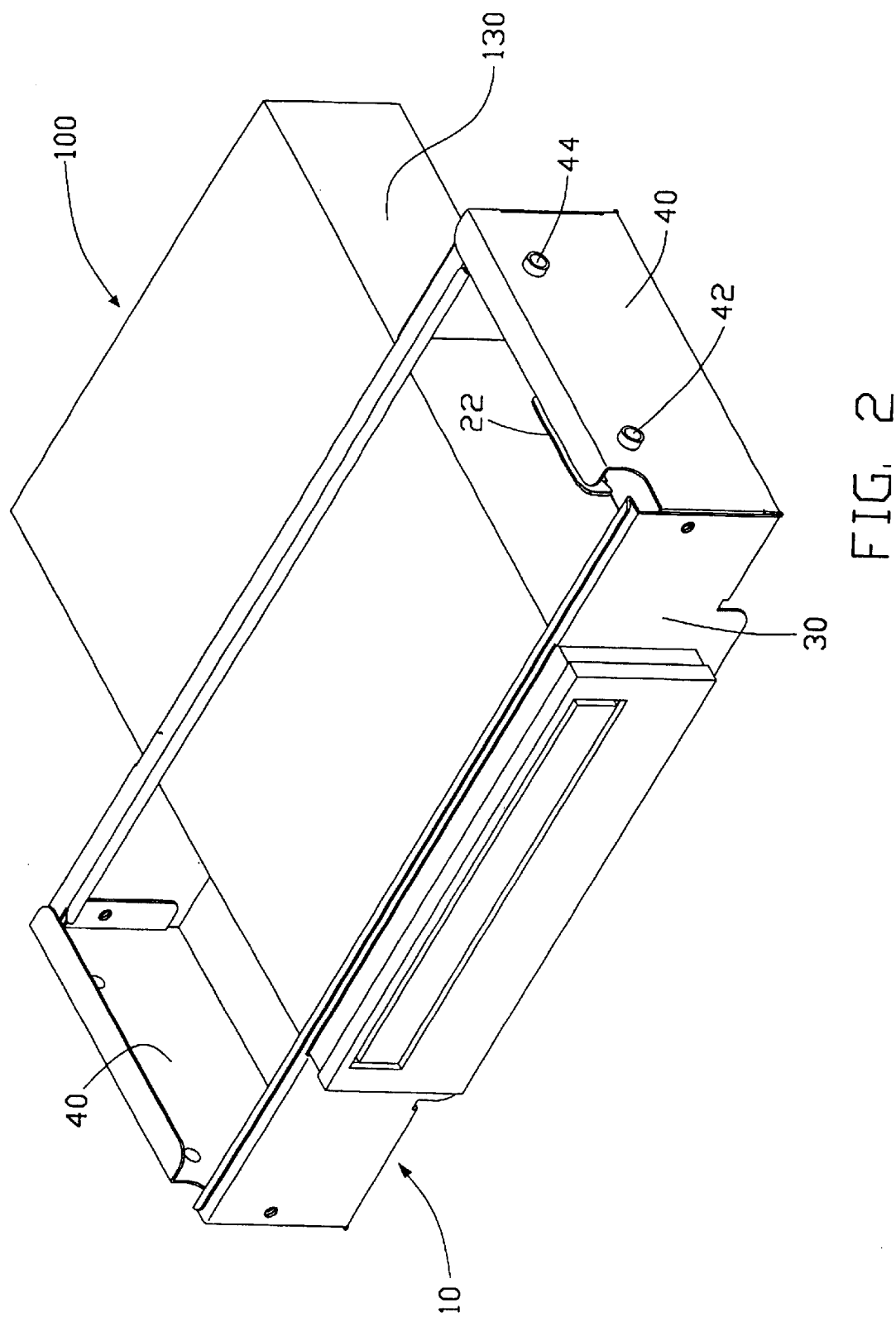
FIG. 2 is an assembled view of FIG. 1.

Referring to FIGS. 1 and 2, the CD-ROM drive 100 has opposite side surfaces 130 and a bottom surface 120 with screw holes (not shown). The drive bracket 10 has a base 20, a front wall 30, a rear wall 31 and two side walls 40 extending between the front wall 30 and the rear wall 31.

Two opposing fixing plates 22 are stamped perpendicularly inwardly from the base 20, to define a passageway therebetween (not labeled) for guiding the CD-ROM drive 100 therethrough. A flare 23 extends forwardly and outwardly from a front end of each fixing plate 22, for guiding the CD-ROM drive 100 to be slidably received into the passageway.

A first opening 32 is defined in the front wall 30 and a second opening 33 is defined in the rear wall 31 in alignment with the first opening 32, for cooperatively receiving the CD-ROM drive 100. The base 20 extends externally from the rear wall 31, forming an external portion (not labeled) corresponding in width to the width of the second opening 33. Screw holes 24 are defined in the base 20 at positions corresponding to the screw holes defined in the bottom surface 120 of the CD-ROM drive 100.

A guiding pivot 42 and a retaining post 44 extend outwardly and perpendicularly from each side wall 40, respectively corresponding to the guiding slot 266 and the retaining recess 268 of the housing 200.

In pre-assembly, the CD-ROM drive 100 is attached to the drive bracket 10. The CD-ROM drive 100 is inserted into the first opening 32, and is then guided by the flares 23 into the passageway defined by the opposite fixing plates 22. The opposite fixing plates 22 interferentially engage the side surfaces 130 of the CD-ROM drive 100, to prevent lateral movement of the CD-ROM drive 100. The CD-ROM drive 100 is so inserted until the screw holes defined in the bottom surface 120 of the CD-ROM drive 100 align with the four screw holes 24 of the drive bracket 10. The CD-ROM drive is then secured to the drive bracket 10 with screws 80.

Figure 4:
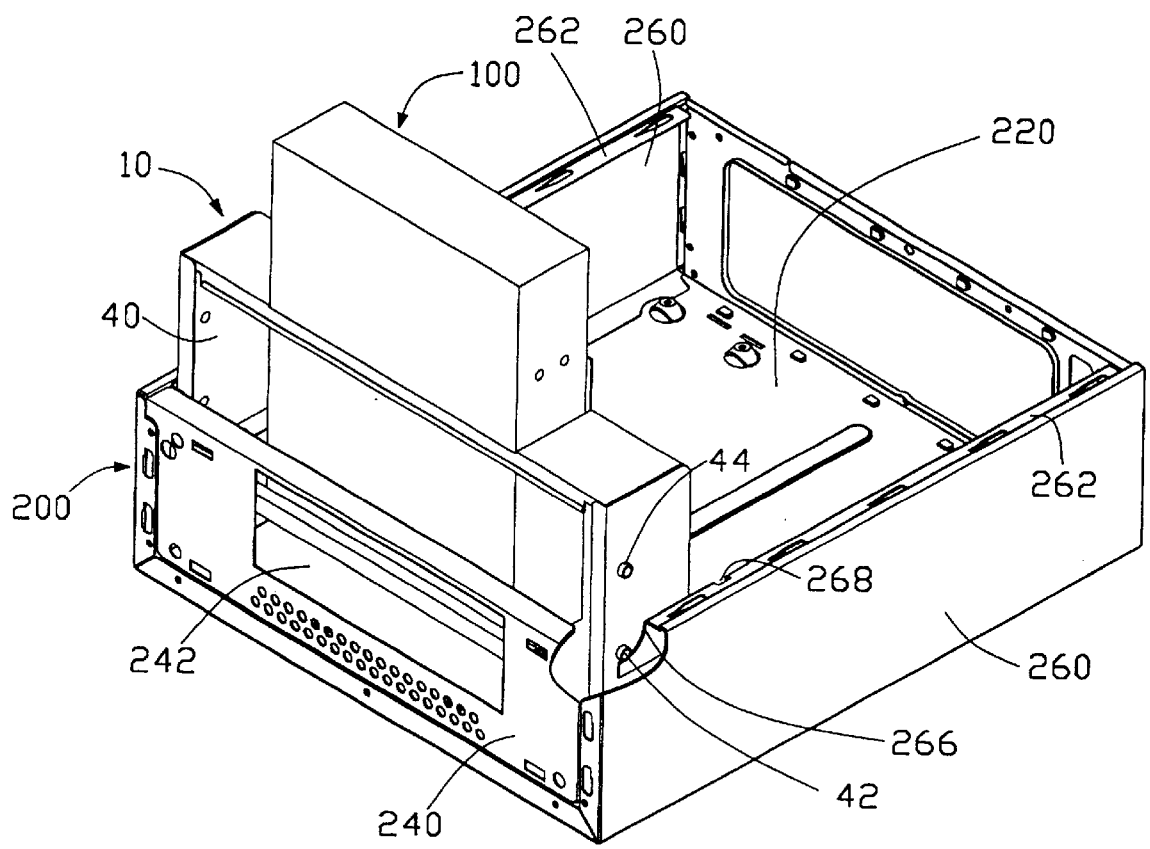
FIG. 4 is an assembled view of FIG. 3, showing the drive bracket in a first position with respect to the computer enclosure.
Figure 5:
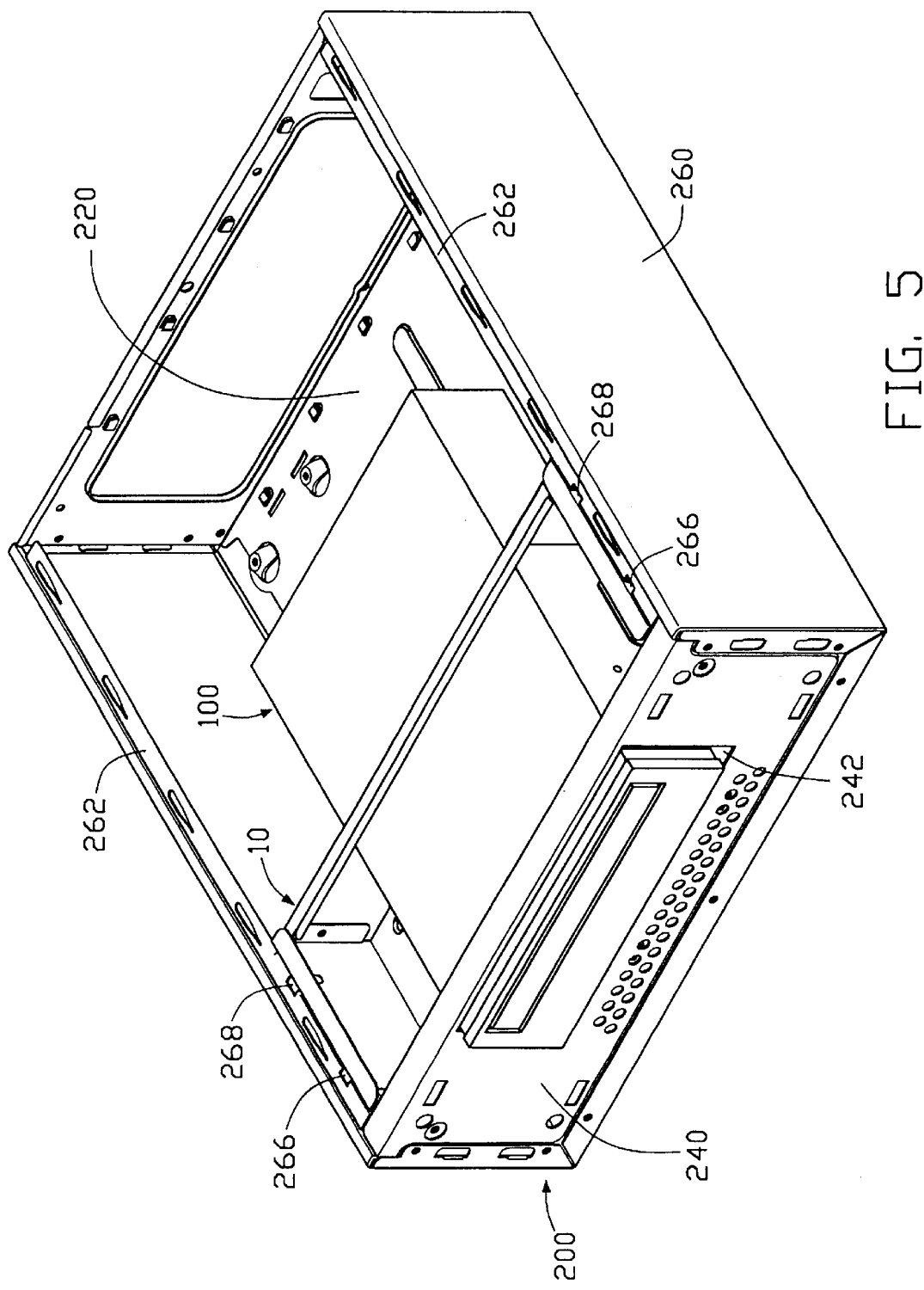
FIG. 5 is similar to FIG. 4, but showing the drive bracket in a second position with respect to the computer enclosure.

Referring to FIGS. 3–5, in assembly, the drive bracket 10 with the CD-ROM drive 100 mounted therein is attached to the housing 200. The drive bracket 10 is held in a vertical orientation, and the guiding pivots 42 of the drive bracket 10 are slidably received in the guiding slots 266 of the housing 200. The drive bracket 10 is pushed downwardly and forwardly, being guided by the guiding slots 266. The drive bracket 10 is so pushed until it reaches a first position whereby the guiding posts 42 have reached ends of the guiding slots 266. At this first position, the drive bracket 10 remains in a vertical orientation (see FIG. 4).

Then the drive bracket 10 is pivoted about the guiding pivots 42 in a downward direction, thereby allowing the retaining posts 44 to enter into the retaining recesses 268. The retaining posts 44 slide down the retaining recesses 268 until the drive bracket reaches a second position. At this second position, the drive bracket 10 is horizontally oriented in the housing 200 (see FIG. 5). The front face (not labeled) of the CD-ROM drive 100 projects through the window 242 of the housing 200 and the top surface (not labeled) of the drive bracket 10 is substantially coplanar with the flanges 262 of the housing 200. When a top panel (not shown) is assembled to the housing 200, upward movement of the drive bracket 10 is prevented. Thus the drive bracket 10 with the CD-ROM 100 mounted therein is readily and firmly retained in the housing 200.

When other components of the computer are required to be mounted in the housing 200 at a location under the drive bracket 10, the drive bracket 10 is pivoted about the guiding pivots 42 from the second position to the first position. This exposes the interior space of the housing 200, thereby facilitating placement/removal of components therein.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A computer enclosure comprising:

a housing having a pair of opposite side panels, each side panel defining at least a guiding slot and at least a retaining recess; and a drive bracket received in the housing, the drive bracket having a plurality of guiding pivots received in the guiding slots and a plurality of retaining posts received in the retaining recesses, the drive bracket being rotatable between a first position and a second position, wherein in the first position a majority of an interior space of the housing is directly accessible from outside the housing, and in the second position the drive bracket is fully and securely installed within the housing.

2. The computer enclosure as described in claim 1, wherein each side panel of the housing inwardly forms at least a bent plate, and wherein the guiding slot and the retaining recess are defined in each respective bent plate.

3. The computer enclosure as described in claim 2, wherein each guiding slot is arcuate.

4. A drive bracket assembly comprising:

a data storage device;

a base supporting the data storage device thereon;

front and rear walls respectively defining first and second openings therethrough providing access for the data storage device; and two side walls each extending between the front and rear walls, and each having a guiding pivot and at least a retaining post.

5. The drive bracket assembly as described in claim 4, wherein the base forms a plurality of upwardly extending fixing plates, to define a passageway therebetween for receiving the data storage device.

6. The drive bracket assembly as described in claim 5, wherein each fixing plate forms a flare for guiding the data storage device into the passageway.

7. A computer enclosure assembly comprising:

a housing defining a pair of side panels, each side panel including an arcuate guiding slot and a retaining recess;

a front panel positioned between said pair of side panels, said front panel defining an opening therein;

a drive bracket received within the housing, said drive bracket defining a pair of guiding pivots received within the corresponding guiding slots, and a pair of retaining posts received within the corresponding retaining recesses; and a drive attached to the drive bracket; wherein said drive bracket with the drive is rotatably and slidably installed into the housing with the guiding pivot moving along the corresponding guiding slot of each side panel until the drive is aligned and exposed to said opening and both the guiding pivots and the retaining posts are substantially located at ends of the corresponding arcuate guiding slots and retaining recesses, respectively.

* * * * *